(12) United States Patent
Hsu

(10) Patent No.: US 8,436,463 B2
(45) Date of Patent: May 7, 2013

(54) PACKAGING SUBSTRATE STRUCTURE WITH ELECTRONIC COMPONENT EMBEDDED THEREIN AND METHOD FOR MANUFACTURE OF THE SAME

(75) Inventor: Shih-Ping Hsu, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 396 days.

(21) Appl. No.: 12/230,345

(22) Filed: Aug. 28, 2008

(65) Prior Publication Data

US 2009/0057873 A1 Mar. 5, 2009

(30) Foreign Application Priority Data

Aug. 28, 2007 (TW) ................. 96131901 A

(51) Int. Cl.
*H01L 23/12* (2006.01)
(52) U.S. Cl.
USPC .... 257/700; 257/698; 257/731; 257/E21.705; 257/E21.499; 174/260
(58) Field of Classification Search ............... 174/260; 361/760; 257/E21.499, E21.705, 698–700
See application file for complete search history.

(56) References Cited

U.S. PATENT DOCUMENTS

| 6,239,980 | B1* | 5/2001 | Fillion et al. | 361/760 |
| 8,022,513 | B2* | 9/2011 | Hsu | 257/668 |
| 2006/0186531 | A1* | 8/2006 | Hsu | 257/700 |
| 2007/0074900 | A1* | 4/2007 | Lee et al. | 174/260 |
| 2008/0006936 | A1* | 1/2008 | Hsu | 257/731 |
| 2008/0054443 | A1* | 3/2008 | Shih | 257/698 |
| 2008/0151518 | A1* | 6/2008 | Hsu et al. | 361/762 |

* cited by examiner

*Primary Examiner* — Eugene Lee
*Assistant Examiner* — Fang-Xing Jiang
(74) *Attorney, Agent, or Firm* — Bacon & Thomas PLLC

(57) ABSTRACT

A packaging substrate structure with an electronic component embedded therein and a fabricating method thereof are disclosed. The packaging substrate structure comprises a core plate; a first built-up structure disposed on a surface of the core plate and comprising a first dielectric layer and a first circuit layer disposed on the first dielectric layer; a second built-up structure disposed on the first built-up structure, wherein a cavity is disposed in the second built-up structure to expose the first built-up structure; an electronic component disposed in the cavity, wherein the electronic component has an active surface having a plurality of electrode pads and an inactive surface facing the first built-up structure; and a solder mask disposed on the surfaces of the second built-up structure and the electronic component, and having a plurality of first openings to expose the electrode pads of the electronic component.

7 Claims, 5 Drawing Sheets

PACKAGING SUBSTRATE STRUCTURE WITH ELECTRONIC COMPONENT EMBEDDED THEREIN AND METHOD FOR MANUFACTURE OF THE SAME

BACKGROUND OF THE INVENTION

1. Field of the Invention

The present invention relates to a packaging substrate structure with an electronic component embedded therein and a method for manufacturing the same and, more particularly, to a packaging substrate structure, which exhibits enhanced electrical performance and reduces costs, with electronic components embedded therein and a method for manufacturing the same.

2. Description of Related Art

As the electronic industry develops rapidly, the technology of semiconductor packaging accordingly moves towards integration and miniaturization so that the demands such as multifunction and high efficiency in electronic devices can be met. In addition, packaging substrates with many active and passive components and circuit connections thereon have advanced from being single-layered boards to multiple-layered boards to expand the space for wiring layout in a limited packaging substrate and to meet the demand of the application of high-density integrated circuits.

With reference to FIG. 1, a flip chip ball grid array (FCBGA) substrate is optimally applied in semiconductor packaging. Herein, the active surface 11a of the chip 11 can be electrically connected to the surface 13a (for adhering a chip) of the packaging substrate 13 by a plurality of solder bumps 12. In addition, according to the design demand, the surface 13a (for adhering a chip) of the packaging substrate 13 can further electrically connect at least one passive component 14, and a plurality of solder balls 15 can be disposed on another surface of the packaging substrate 13 to function as I/O joints. The aforementioned structure has become mainstream technology for packaging chips and electronic components.

However, in a flip chip ball grid array package structure, the passive components 14 are disposed outside of the packaging substrate 13 by surface mount technology (SMT). Thereby, when a significant amount of passive components 14 are disposed on the surface of the packaging substrate 13 according to the design demand, it is necessary to increase the surface area of the packaging substrate 10 to dispose thereon the increased passive components 14. Accordingly, the purpose for miniaturization cannot be achieved. In addition, the number of the passive components 14 is limited to the restricted area of the packaging substrate 10, and thereby the demands for compact and lightweight electronic devices have not been met.

Furthermore, the fact that passive components 14 are disposed on the surface of the packaging substrate 13 causes long transmission paths, large parasitic induction, poor electrical performance and thus the accuracy of signal transmission is badly influenced. Besides, the passive components 14 disposed on the surface of the packaging substrate 13 make the height of the package structure increase and thus the demand for a light and compact-sized product cannot be met.

SUMMARY OF THE INVENTION

The object of the present invention is to provide a packaging substrate structure with an electronic component embedded therein and a method for manufacturing the same so as to save the space for wiring layout and to enhance electrical performance.

In order to achieve the object mentioned above, the present invention provides a packaging substrate structure with an electronic component embedded therein, comprising: a core board; a first built-up structure disposed on at least one surface of the core board, and comprising at least one first dielectric layer, at least one first wiring layer disposed on the first dielectric layer, and a plurality of first conductive vias; a second built-up structure disposed on the surface of the first built-up structure and having a cavity to expose the first built-up structure; an electronic component disposed in the cavity and having an active surface and an inactive surface, wherein the active surface has a plurality of electrode pads, and the inactive surface faces the first built-up structure; and a solder mask disposed on the surfaces of the second built-up structure and the electronic component, wherein the solder mask has a plurality of first openings to expose the electrode pads of the electronic component.

In the abovementioned packaging substrate structure of the present invention, the second built-up structure can comprise at least one second dielectric layer, at least one second wiring layer disposed on the second dielectric layer, and a plurality of second conductive vias electrically connecting with the second wiring layer, wherein the outmost second wiring layer has a plurality of conductive pads. Besides, the second wiring layer of the second built-up structure can have a metal layer disposed around the cavity. Furthermore, the solder mask can further have a plurality of second openings to expose the conductive pads of the second built-up structure. The foregoing structure can further comprise a third built-up structure disposed between the solder mask and the second built-up structure together with the electronic component, wherein the third built-up structure has a plurality of third conductive vias of which a part electrically connect to the conductive pads of the second built-up structure, and another part electrically connect to the electrode pads of the electronic component.

In the foregoing packaging substrate structure of the present invention, the first wiring layer of the first built-up structure can have a metal layer corresponding to the cavity of the second built-up structure for attaching the inactive surface of the electronic component.

The packaging substrate structure of the present invention can further comprise an adhesive layer disposed between the inactive surface of the electronic component and the surface of the first built-up structure The packaging substrate structure of the present invention can further comprise an adhesive material filling gap between the cavity and the electronic component to fix the electronic component.

In the packaging substrate structure of the present invention, the width of the cavity increases from inside to outside.

The present invention further provides a method for manufacturing a packaging substrate structure with an electronic component embedded therein, comprising: providing a core board having a wiring layer on the two opposite surfaces thereof; forming a first built-up structure on at least one surface of the core board, wherein the first built-up structure has at least one first dielectric layer, at least one first wiring layer disposed on the first dielectric layer, and a plurality of first conductive vias; forming a second built-up structure on the surface of the first built-up structure, wherein the second built-up structure has a metal block formed therein, and a part of the metal block is etched to form a cavity exposing the first built-up structure; embedding an electronic component in the cavity, wherein the electronic component has an active surface having a plurality of electrode pads, and an inactive surface facing the surface of the core board; and forming a solder mask on the surfaces of the second built-up structure and the electronic component, wherein the solder mask has a plurality of first openings to expose the electrode pads of the electronic component.

In the aforementioned method, the second built-up structure can have at least one second dielectric layer, at least one second wiring layer disposed on the second dielectric layer, and a plurality of second conductive vias electrically connecting to the second wiring layer, and the outmost second wiring layer of the second built-up structure has a plurality of conductive pads.

In the aforementioned method, the second built-up structure can be formed by the following steps: (a1) forming a second dielectric layer, and forming the predetermined cavity and a plurality of vias in the second dielectric layer; (a2) forming a seed layer on the surface of the second dielectric layer, on the inside surfaces of the predetermined cavity and the vias; (a3) forming a patterned resist layer on the surface of the seed layer, wherein the patterned resist layer has open areas, and parts of the open areas correspond to the predetermined cavity and the vias of the second dielectric layer to expose the seed layer; (a4) forming a second wiring layer, a plurality of second conductive vias and the metal block in the open areas by electroplating; (a5) removing the patterned resist layer and the seed layer thereunder; and (a6) repeating the steps of (a1) to (a5) to form a multilayer built-up structure.

In the method of the present invention, at least one second wiring layer forms a metal layer surrounding the cavity, while the cavity is formed in the second built-up structure by etching.

In the method of the present invention, the outmost first wiring layer of the first built-up structure can have a metal layer corresponding to the cavity of the second built-up structure for attaching the inactive surface of the electronic component.

In the method of the present invention, the solder mask can further have a plurality of second openings to expose the conductive pads of the second built-up structure. Besides, the foregoing method can further comprise a step of forming a plurality of solder bumps disposed on the surfaces of the conductive pads and the electrode pads. Alternatively, the foregoing method can further comprise a step for forming a third built-up structure between the solder mask and the first built-up structure together with the electronic component, wherein the third built-up structure has a plurality of third conductive vias, a part of the third conductive vias electrically connect to the conductive pads of the first built-up structure, and another part of the third conductive vias electrically connect to the electrode pads of the electronic component.

In the method of the present invention, the inactive surface of the electronic component can be attached to the surface of the first built-up structure through an adhesive layer.

The method of the present invention can further comprise a step of filling a gap between the cavity and the electronic component with an adhesive material to fix the electronic component.

Other objects, advantages, and novel features of the invention will become more apparent from the following detailed description when taken in conjunction with the accompanying drawings.

DETAILED DESCRIPTION OF THE PREFERRED EMBODIMENT

Because the specific embodiments illustrate the practice of the present invention, a person having ordinary skill in the art can easily understand other advantages and efficiency of the present invention through the content disclosed therein. The present invention can also be practiced or applied by other variant embodiments. Many other possible modifications and variations of any detail in the present specification based on different outlooks and applications can be made without departing from the spirit of the invention.

Method Embodiment 1

Figure 1:
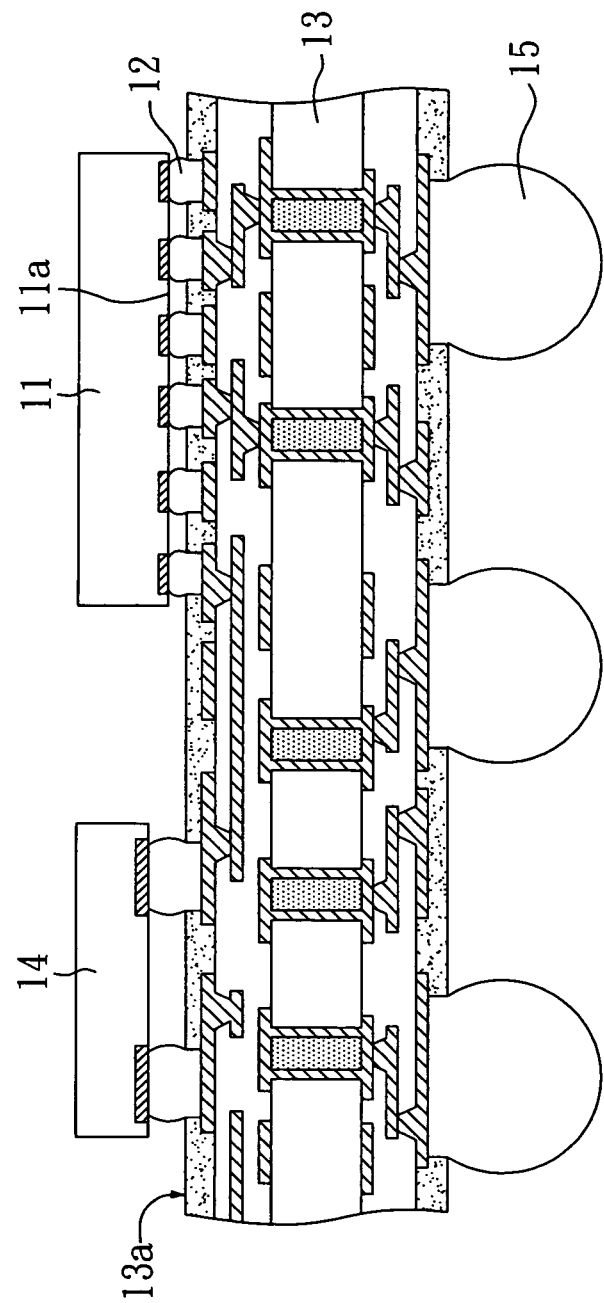
FIG. 1 is a cross-sectional view of a conventional packaging substrate structure having passive components mounted thereon.
Figure 2A:
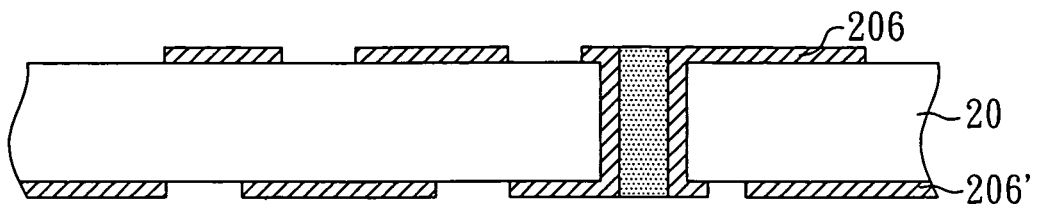
FIGS. 2A to 2E are cross-sectional views for illustrating a process for manufacturing a packaging substrate structure with an electronic component embedded therein in a preferred embodiment of the present invention.

With reference to FIG. 2A, a core board 20 with wiring layers 206, 206' disposed on two opposite surface thereof is first provided.

Figure 2B:
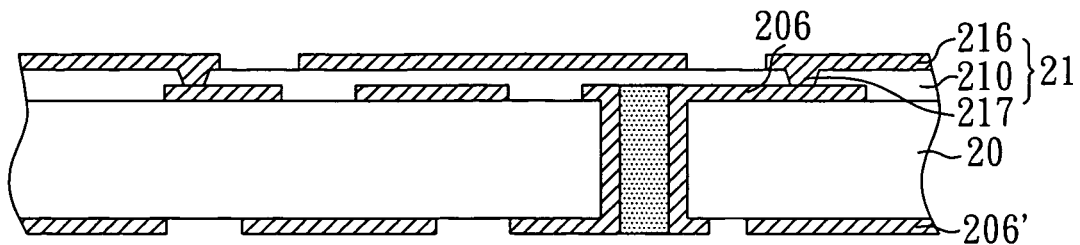

Subsequently, as shown in FIG. 2B, a first built-up structure 21 is formed on at least one surface of the core board 20. Herein, the first built-up structure 21 has at least one first dielectric layer 210, at least one first wiring layer 216 disposed on the first dielectric layer 210, and a plurality of first conductive vias 217 electrically connecting the first wiring layer 216 and the wiring layer 206 disposed on the surface of the core board 20.

Figure 2C:
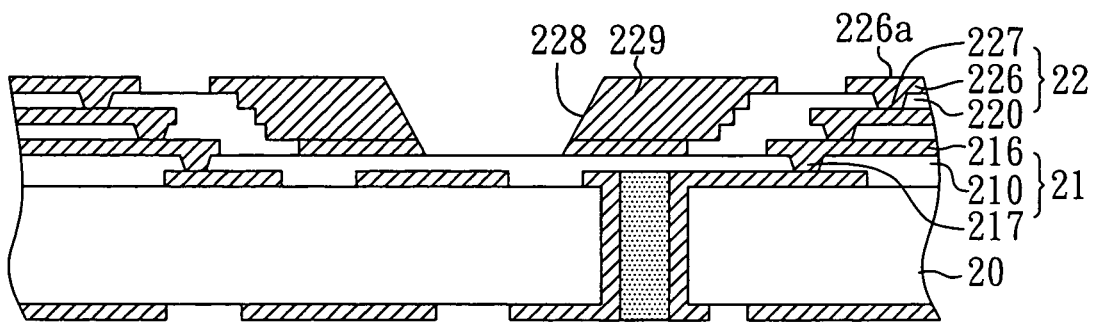

Then, as shown in FIG. 2C, a second built-up structure 22 is formed on the surface of the first built-up structure 21. The second built-up structure 21 has a metal block including a metal layer 229, and a cavity 228 is formed by etching and removing a part of the metal block to expose the first built-up structure 21. Herein, the second built-up structure 22 has at least one second dielectric layer 220, at least one second wiring layer 226 disposed on the second dielectric layer 220, and a plurality of second conductive vias 227 electrically connecting the second wiring layer 226 and the first wiring layer 216. The outmost second wiring layer 226 of the second built-up structure 22 has a plurality of conductive pads 226a. With reference to FIGS. 3A to 3F, there is shown a process for forming the second built-up structure 22. As shown in FIG. 3A, a second dielectric layer 220 is formed on at least one side of the core board 20. A predetermined cavity 221 and a plurality of vias 222 are formed in the second dielectric layer 220. Subsequently, as shown in FIG. 3B, a seed layer 223 is formed on the surfaces of the second dielectric layer 220, and on the inside surfaces of the predetermined cavity 221 and the vias 222. Then, as shown in FIG. 3C, a patterned resist layer 224 is formed on the surface of the seed layer 223, and the patterned resist layer 224 has open areas 225. Herein, parts of the open areas 225 corresponds to the predetermined cavity 221 and the vias 222 of the second dielectric layer 220 to expose the seed layer 223. As shown in FIG. 3D, a second wiring layer 226, a plurality of second conductive vias 227 and a metal block in the predetermined cavity 221 are formed in the open areas 225 of the resist layer 224 by electroplating. Next, as shown in FIG. 3E, the patterned resist layer 224 and the seed layer 223 thereunder are removed. Finally, as shown in FIG. 3F, a multilayer built-up structure is formed by repeating the steps shown in FIGS. 3A to 3E. With reference to FIG. 2C, while a cavity 228 is formed in the second built-up structure 22 by etching, at least one second wiring layer 226 forms a metal layer 229 surrounding the cavity 228 to expose partial surface of the first dielectric layer 210 of the first built-up structure 21. Herein, the second built-up structure 22 shown in FIG. 2C also comprises the seed layer 223 shown in FIG. 3F. However, in order to clarify the figures, the seed layer 223 is not shown in FIGS. 2C~2F, 4 and 5.

Figure 2D:
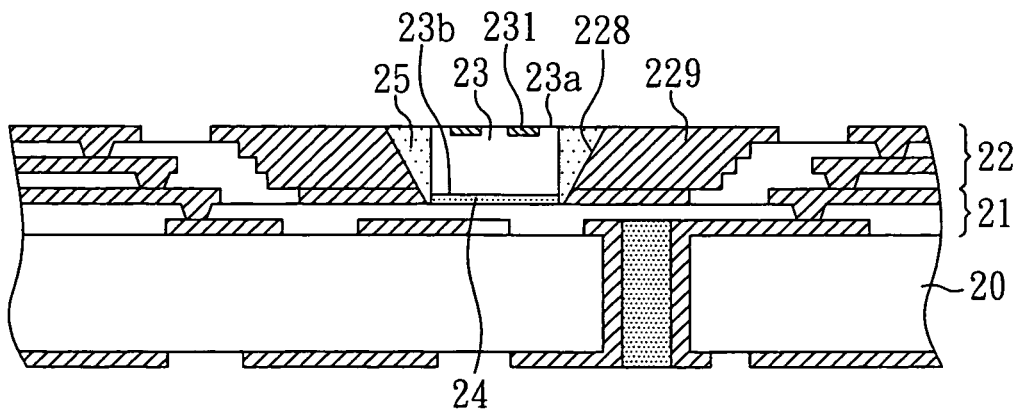
Figure 3A:
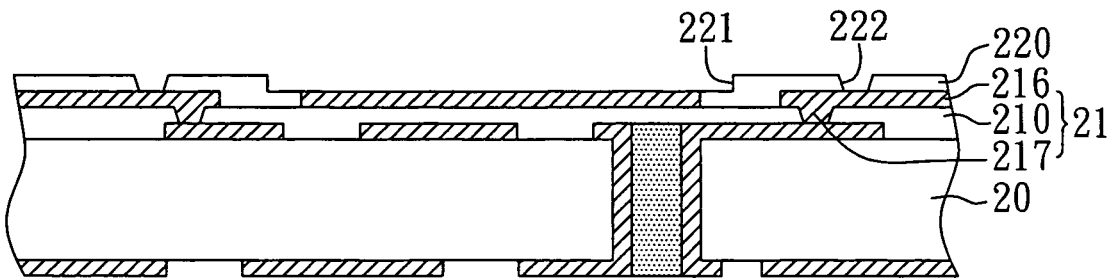
FIGS. 3A to 3F are cross-sectional views for illustrating a process for fabricating a second built-up structure of a preferred embodiment of the present invention.
Figure 3B:
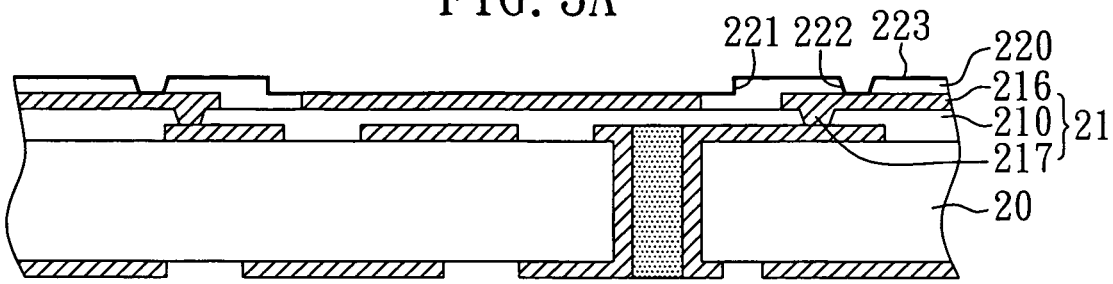
Figure 3C:
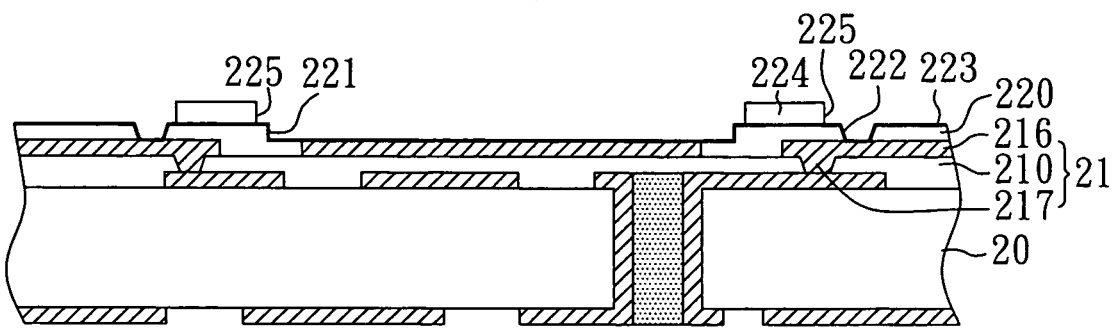
Figure 3D:
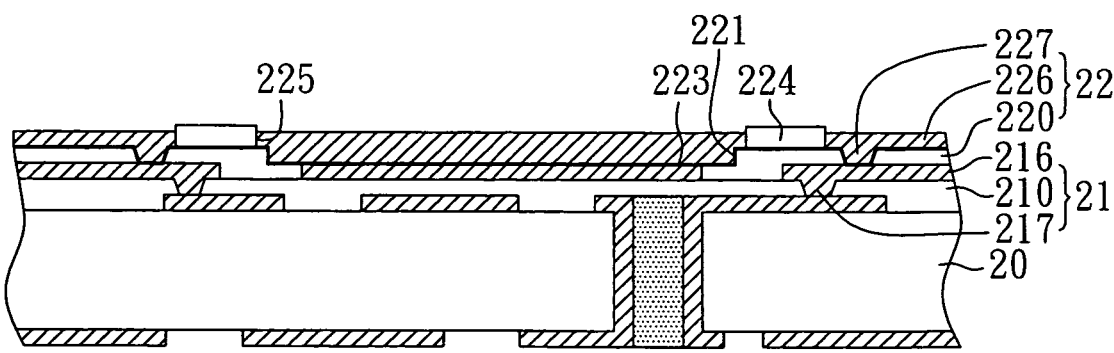
Figure 3E:
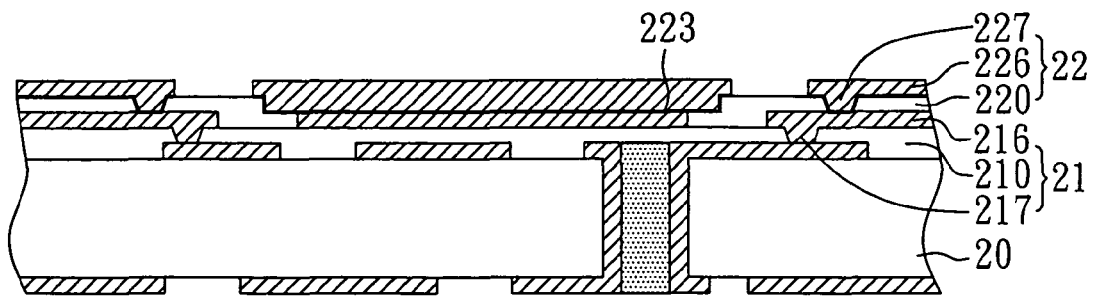
Figure 3F:
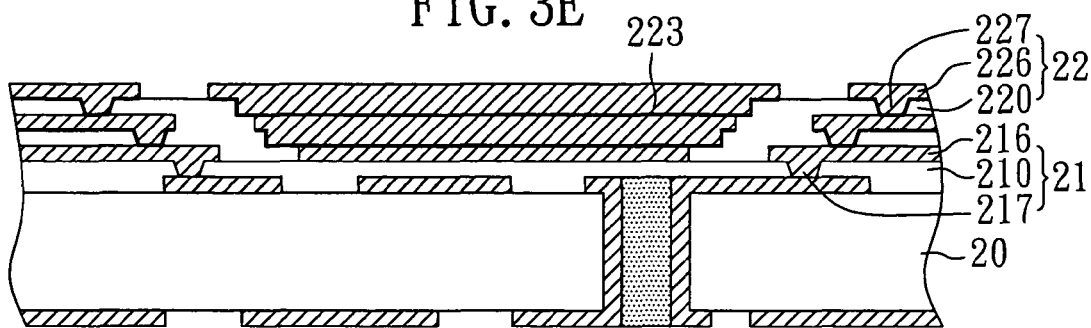

Subsequently, as shown in FIG. 2D, an electronic component 23 is embedded in the cavity 228. The inactive surface 23b of the electronic component 23 is attached to the surface of the first built-up structure 21 through an adhesive layer 24. In addition, a gap between the cavity 228 and the electronic component 23 is filled with an adhesive material 25 to fix the electronic component 22. Herein, the electronic component 23 has an active surface 23a and an inactive surface 23b. The active surface 23a has a plurality of electrode pads 231, and the inactive surface 23b faces the first built-up structure 21.

Figure 2E:
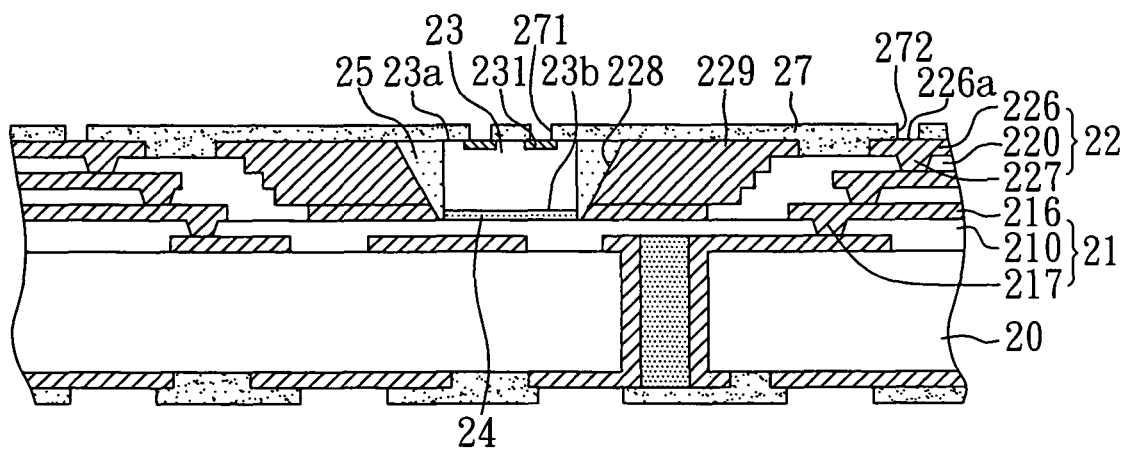

Finally, as shown in FIG. 2E, a solder mask 27 is formed on the surfaces of the second built-up structure 22 and the electronic component 23. The solder mask 27 has a plurality of first openings 271 and second openings 272 to respectively expose the electrode pads 231 of the electronic component 23 and the conductive pads 226a of the second built-up structure 22.

Figure 2F:
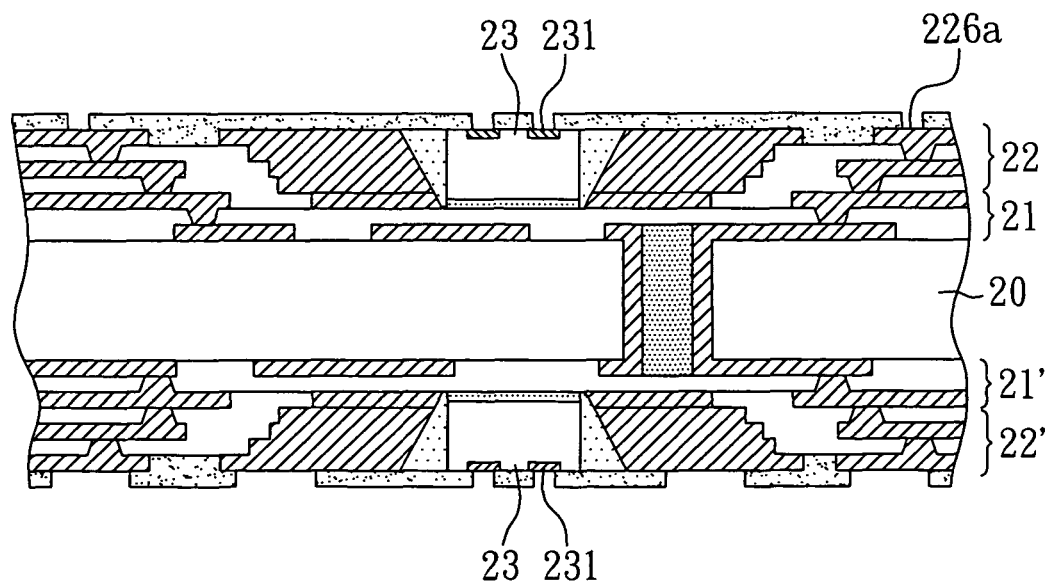
FIG. 2F is a cross-sectional view of a packaging substrate structure with electronic components embedded therein in another preferred embodiment of the present invention.

Besides, as shown in FIG. 2F, built-up structures 21, 22, 21' and 22' with an electronic component embedded therein can be formed symmetrically on both sides of the core board 20 in the same manner as the above-mentioned Method Embodiment 1.

Structure Embodiment 1

With reference to FIGS. 2E and 2F, the packaging substrate structure with an electronic component embedded therein according to the present embodiment comprises: a core board 20; a first built-up structure 21, 21' disposed on at least one surface of the core board 20 and comprising at least one first dielectric layer 210, at least one first wiring layer 216 disposed on the first dielectric layer 210, and a plurality of first conductive vias 217; a second built-up structure 22, 22' disposed on the surface of the first built-up structure 21, 21' and having a cavity 228 to expose the first built-up structure 21, 21'; an electronic component 23 disposed in the cavity 228 and having an active surface 23a and an inactive surface 23b, wherein the active surface 23a has a plurality of electrode pads 231, and the inactive surface 23b faces the first built-up structure 21; and a solder mask 27 disposed on the surfaces of the second built-up structure 22, 22' and the electronic component 23, wherein the solder mask 27 has a plurality of first openings 271 to expose the electrode pads 231 of the electronic component 23.

In the abovementioned structure, the second built-up structure 22, 22' comprises at least one second dielectric layer 220, at least one second wiring layer 226 disposed on the second dielectric layer 220, and a plurality of second conductive vias 227 electrically connecting with the second wiring layer 226, wherein the outmost second wiring layer 226 has a plurality of conductive pads 226a. Besides, the second wiring layer 226 of the second built-up structure 22 has a metal layer 229 disposed around the cavity 228.

In the abovementioned structure, the solder mask 27 further has a plurality of second openings 272 to expose the conductive pads 226a of the second built-up structure 22, 22'.

The abovementioned structure further comprises an adhesive layer 24 disposed between the inactive surface 23b of the electronic component 23 and the surface of the first built-up structure 21, 21'.

The abovementioned structure further comprises an adhesive material 25 filling a gap between the cavity 228 and the electronic component 23 to fix the electronic component 23.

In the abovementioned structure, the width of the cavity 228 increases inside out.

Method and Structure Embodiment 2

Figure 4:
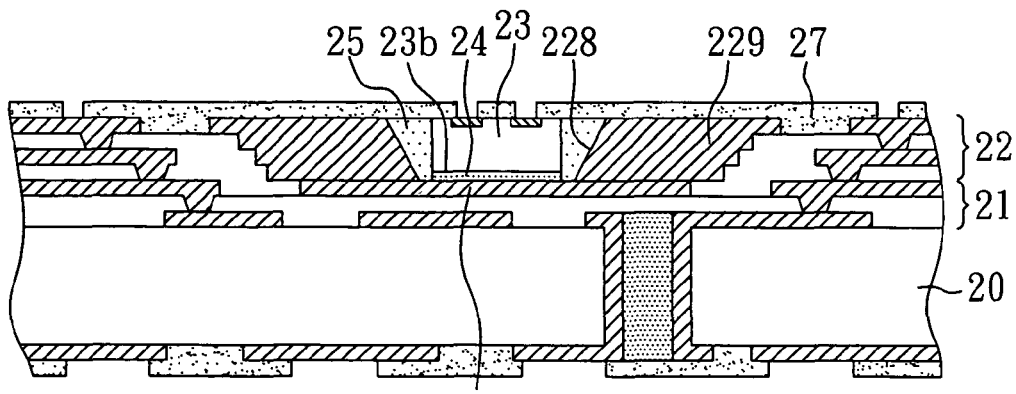
FIG. 4 is a cross-sectional view of a packaging substrate structures with an electronic component embedded therein of another preferred embodiment of the present invention.

The method and the structure in the present embodiment are the same as those in Method Embodiment 1 and Structure Embodiment 1, except the outmost wiring layer 216 of the first built-up structure has a metal layer 219 corresponding to the cavity 228 of the second built-up structure 22 for attaching the inactive surface 22b of the electronic component 22 as shown in FIG. 4.

Method and Structure Embodiment 3

Figure 5:
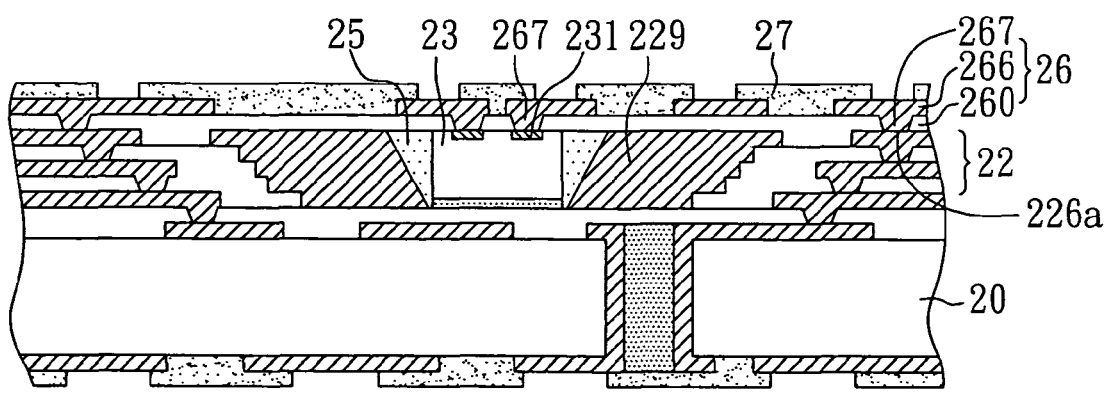
FIG. 5 is a cross-sectional view of a packaging substrate structures with an electronic component embedded therein of another preferred embodiment of the present invention

The method and the structure in the present embodiment are the same as those in Method Embodiment 1 and Structure Embodiment 1, except a third built-up structure 26 can further be formed between the solder mask 27 and the second built-up structure 22 together with the electronic component 23 as shown in FIG. 5. Herein, the third built-up structure 26 has at least one third dielectric layer 260, at least one third wiring layer 266 disposed on the third dielectric layer 260, and a plurality of third conductive vias 267. In addition, a part of the third conductive vias 267 in the third built-up structure 25 electrically connect to the conductive pads 226a of the second built-up structure 22, and another part of the third conductive vias 267 electrically connect to the electrode pads 231 of the electronic component 23.

Although the present invention only illustrates the structure where the built-up structure is formed on only one side of the core board and the method for fabricating the same, the scope of the present invention is not limited thereto. In practice, the built-up structure also can be formed on two sides of a packaging substrate.

The packaging substrate structure with an electronic component embedded therein and the method for manufacturing the same according to the present invention can improve the drawbacks occurring in a conventional packaging substrate, such as consuming space for placing passive components on the surface of a packaging substrate, long transmission paths, high parasitic capacitance, poor electrical performance, and the large height of electronic components resulting in that the demands for a light and compact-sized product cannot be meet. Accordingly, the packaging substrate structure with an electronic component embedded therein and the method for manufacturing the same according to the present invention can efficiently save the space for wiring layout and improve electrical performance.

Although the present invention has been explained in relation to its preferred embodiment, it is to be understood that many other possible modifications and variations can be made without departing from the scope of the invention as hereinafter claimed.

What is claimed is:

1. A packaging substrate structure with an electronic component embedded therein, comprising:
    a core board;
    a first built-up structure disposed on at least one surface of the core board, and comprising at least one first dielectric layer, at least one first wiring layer disposed on the first dielectric layer, and a plurality of first conductive vias disposed in the first dielectric layer and electrically connecting with the first wiring layer;
    a second built-up structure disposed on the surface of the first built-up structure and having a metal block penetrating through the second built-up structure, wherein the metal block has a cavity to expose the first built-up structure and the second built-up structure comprises at least one second dielectric layer, at least one second wiring layer disposed on the second dielectric layer, and a plurality of second conductive vias disposed in the second dielectric layer and electrically connecting with the second wiring layer, therewith the outmost second wiring layer having a plurality of conductive pads;
    an electronic component disposed in the cavity and having an active surface and an inactive surface, wherein the active surface has a plurality of electrode pads, and the inactive surface faces the first built-up structure; and
    a solder mask disposed on the surfaces of the second built-up structure and the electronic component, wherein the solder mask has a plurality of first openings to expose the electrode pads of the electronic component and further has a plurality of second openings such that the conductive pads of the second built-up structure are not covered by the solder mask.

2. The packaging substrate structure as claimed in claim 1, wherein the first built-up structure further comprises a metal layer disposed on a surface thereof and corresponding to the cavity of the second built-up structure for attaching the inactive surface of the electronic component.

3. The packaging substrate structure as claimed in claim 1, further comprising a plurality of solder bumps disposed on the surfaces of the conductive pads and the electrode pads.

4. The packaging substrate structure as claimed in claim 2, further comprising an adhesive layer disposed between the inactive surface of the electronic component and the surface of the metal layer.

5. The packaging substrate structure as claimed in claim 1, further comprising an adhesive material filling a gap between the cavity and the electronic component to fix the electronic component.

6. The packaging substrate structure as claimed in claim 1, wherein the width of the cavity increases inside out.

7. The packaging substrate structure as claimed in claim 1, further comprising an adhesive layer disposed between the inactive surface of the electronic component and the surface of the first dielectric layer.

* * * * *